US007240085B2

(12) United States Patent
Thayer et al.

(10) Patent No.: US 7,240,085 B2
(45) Date of Patent: *Jul. 3, 2007

(54) FASTER SHIFT VALUE CALCULATION USING MODIFIED CARRY-LOOKAHEAD ADDER

(75) Inventors: Paul R. Thayer, Fort Collins, CO (US); Sanjay Kumar, Livermore, CA (US)

(73) Assignees: Hewlett-Packard Development Company, L.P., Houston, TX (US); Intel Corporation, Santa Clara, CA (US)

( * ) Notice: Subject to any disclaimer, the term of this patent is extended or adjusted under 35 U.S.C. 154(b) by 653 days.

This patent is subject to a terminal disclaimer.

(21) Appl. No.: 10/613,095

(22) Filed: Jul. 7, 2003

(65) Prior Publication Data

US 2004/0068531 A1    Apr. 8, 2004

Related U.S. Application Data

(63) Continuation-in-part of application No. 09/507,376, filed on Feb. 18, 2000, now abandoned.

(51) Int. Cl.
*G06F 7/38* (2006.01)
(52) U.S. Cl. .................................................... 708/501
(58) Field of Classification Search ............... 708/501, 708/708, 709
See application file for complete search history.

(56) References Cited

U.S. PATENT DOCUMENTS 5,636,157 A * 6/1997 Hesson et al. ............. 708/714
5,719,803 A * 2/1998 Naffziger .................. 708/710
5,790,444 A * 8/1998 Olson et al. ............... 708/501

\* cited by examiner

*Primary Examiner*—Chuong D. Ngo

(57) ABSTRACT

Circuitry for reducing propagation delays in calculation of a value for use in a floating point multiply-accumulate operation. In the circuitry, a carry-save adder receives values of three input operands from three latches. A carry-lookahead adder receives the outputs from the carry-save adder and implements an XOR operation on a most-significant bit along with its own logic operation to produce a value for the floating point multiply-accumulate operation. Modification of the carry-lookahead adder to perform the XOR operation results in elimination of an entire stage of logic.

8 Claims, 4 Drawing Sheets

FASTER SHIFT VALUE CALCULATION USING MODIFIED CARRY-LOOKAHEAD ADDER

CROSS REFERENCE TO RELATED APPLICATION

This application is a continuation-in-part of U.S. patent application Ser. No. 09/507,376, filed Feb. 18, 2000 now abandoned, and entitled "Faster Shift Value Calculation Using Modified Carry-Lookahead Adder."

FIELD OF THE INVENTION

The present invention relates to an apparatus and method for use in implementing a floating point multiply-accumulate operation.

BACKGROUND OF THE INVENTION

Logic circuitry has been developed to implement a floating point multiply-accumulate operation (FMAC). This operation performs on three operands (A, B, C) the operation A*B+C. The FMAC operation is useful in that it can be used to implement both addition and multiplication in logic circuitry. In particular, for an add operation, the operand A is set to a value one. For a multiply operation, the operand C is set to a value zero.

For example, FIG. 1 is a diagram of a prior art circuit 10 for use in implementing an FMAC operation. In circuit 10, three latches 12, 14, and 16 contain three 17-bit operands A, B, and C. The values of those operands are input to a first carry-save adder (CSA) 18. The result of the first CSA 18 is input to a second CSA 20 along with the value of a constant received on line 22. Finally, the output of the second CSA adder 20 is input to a carry-lookahead adder (CLA) 24, which performs an add operation and outputs a resulting shift value on line 26 for use in an FMAC operation.

The shift value is used to line up the mantissas for the add portion of the FMAC operation. The floating point numbers used by the FMAC operation are each expressed as a mantissa and an exponent. The result of the multiply operation (A*B) produces a product that typically has a different exponent than the exponent of operand C. The FMAC operation uses the shift value to shift, and hence "line up," the mantissa of operand C for adding it with the mantissa of the A*B product. Although the mantissa of operand C is shifted, the mantissa of the A*B product could alternatively be shifted to perform the add operation. Calculating the shift value and performing the shifting of the mantissa of operand C occur during the multiply operation. The format of floating point numbers, the addition of floating point numbers and the multiplication of floating point numbers are known in the art.

Using these multiple stages within circuit 10 to produce the shift value can introduce a significant amount of delay in performing the FMAC operation. Accordingly, a need exists for a faster method of implementing an FMAC operation.

SUMMARY OF THE INVENTION

An embodiment consistent with the present invention reduces propagation delays within a circuit for performing an FMAC operation. An apparatus consistent with the present invention includes a plurality of latches for containing a plurality of operands. A CSA circuit performs a CSA operation on the operands to produce a first result, and a logic block performs a CLA operation on the first result to produce a second result. A logic circuit in the logic block performs a logic operation on the second result based upon a control signal to produce a shift value for use in the FMAC operation.

A method consistent with the present invention includes receiving a plurality of operands. A CSA operation is performed on the operands to produce a first result, and a CLA operation is performed on the first result to produce a second result. A logic operation is performed on the second result, as part of the CLA operation, based upon a control signal to produce a shift value for use in the FMAC operation.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Circuitry consistent with the present invention reduces propagation delays in performing an FMAC operation by eliminating one stage of logic used in generating a shift value for the operation. Another stage of logic is modified to perform a parallel logic operation and account for the reduced logic stage. This results in increased speed of execution in calculating the shift value for use in an FMAC operation.

Figure 1:
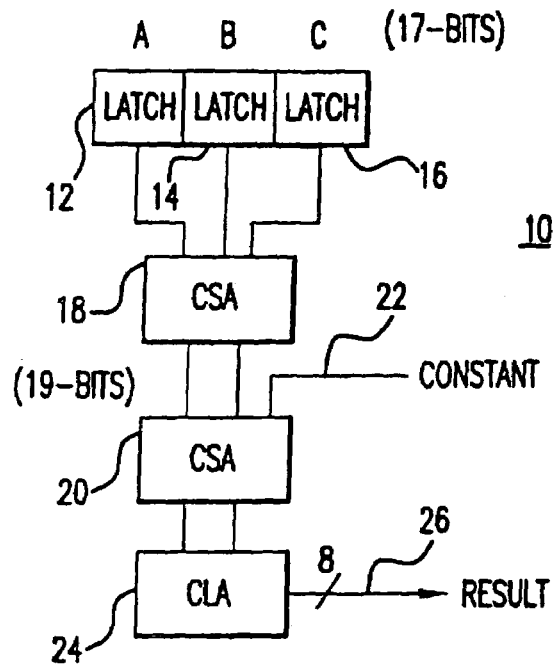
FIG. 1 is a logic diagram of a prior art circuit for use in implementing an FMAC operation.
Figure 2:
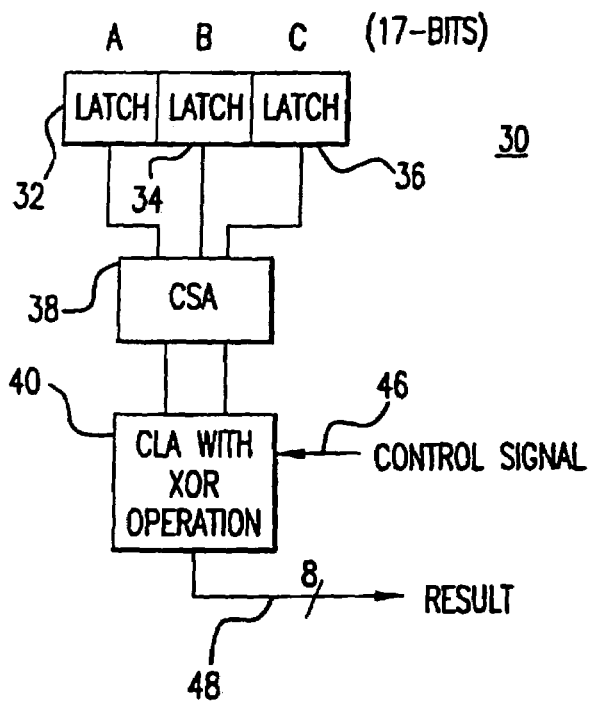
FIG. 2 is a logic diagram of a circuit for use in implementing an FMAC operation consistent with the present invention.

FIG. 2 is a logic diagram of a circuit 30 for use in performing an FMAC operation consistent with the present invention. Circuit 30 illustrates modification of prior art circuit 10 shown in FIG. 1. Circuit 30 includes three latches 32, 34, and 36 for containing three operands A, B and C for the FMAC operation, shown as 17-bit operands in this example. A CSA 38 receives the values of operands A, B, and C from latches 32, 34, and 36. In circuit 30, however, a second CSA corresponding with CSA 20 in circuit 10 is eliminated. Elimination of the second CSA increases speed of calculation of the resulting shift value for use in an FMAC operation by eliminating one stage of logic; it thus reduces the corresponding propagation delays.

A logic block 40 receives the outputs from CSA 38 and provides a resulting shift value on line 48. The shift value is used, as explained above, to line up mantissas for the add operation. In this example, logic block 40 is implemented using a CLA that is modified to logically perform an exclusive-OR (XOR) operation on the result of the CLA operation based upon a control signal 46. The XOR function is performed on the most significant bit of the result.

As shown in FIGS. 1 and 2 of the Drawings, CLAs 24 and 40 generate 8-bit results, and, accordingly, take 8-bit inputs.

In an effort to speed up the addition operation, these adders preferably process the input data in 4-bit nibbles. As is known in the art, the adders first generate PKG terms for each nibble, where equations P=A XOR B, K=not (A OR B) and G=A AND B may be used to determine the propagate, kill and generate signals, respectively. The adders then compute the carry signal, e.g. CARRY $C_{i+1}=G_i$ OR (NOT ($K_i$) AND $C_i$), passing from one 4-bit nibble to the next. Finally, the sum is computed using the PKG and carry signals, e.g., $S_i=P_i$ XOR $C_i$. Since the circuitry for the PKG and carry signal generation are well known in the art, such as in Weste and Eshraghian, "Principles of CMOS VLSI Design: A Systems Perspective," 1993, only the circuitry in the final stage is described herein.

Control signal 46 is generated based upon whether the FMAC operation is of Single Instruction, Multiple Data (SIMD) type or non-SIMD type. SIMD operations are known in the art. For example, SIMD indicates packing two single precision (32 bit) floating point numbers in registers normally meant for a single double precision (64 bit) floating point number. SIMD calculations are, accordingly, used where full precision floating point calculations are not needed, thereby doubling the throughput of operations by accepting only single precision results. More detail regarding the usage of SIMD in computation is found throughout the literature, e.g., Abel et al., "Applications Tuning for Streaming SIMD Extensions," Intel Technology Journal Q2, 1999.

As explained below, the XOR operation can be implemented within the existing circuitry of a CLA in logic block 40 and thus does not generate any additional propagation delay. The second CSA 20 can be eliminated based upon how the constant on line 22 operates. In particular, the second CSA 20 in circuit 10 uses only the lower eight bits of the constant on line 22, and those lower eight bits only vary in the most significant bit position. This variance is known because the FMAC operation uses a standard for operating on floating point numbers, as specified in IEEE Standard for Binary Floating-Point Arithmetic, IEEE Std. 754-1985, which is incorporated herein by reference. In addition, CSAs and CLAs, along with the operations they implement, are known in the art. In particular, the structure and workings of carry-save and carry-lookahead adders are well known in the art, as are the equations for sum, carry, propagate (P), generate (G) and kill (K). The basic principles for the implementation of such adders are set forth in numerous texts, such as Weste and Eshraghian, hereinabove, which is also incorporated herein by reference. It should be understood that these equations are readily implemented in static or dynamic logic families, e.g., single-rail or dual-rail (mousetrap) logic.

Figure 3:
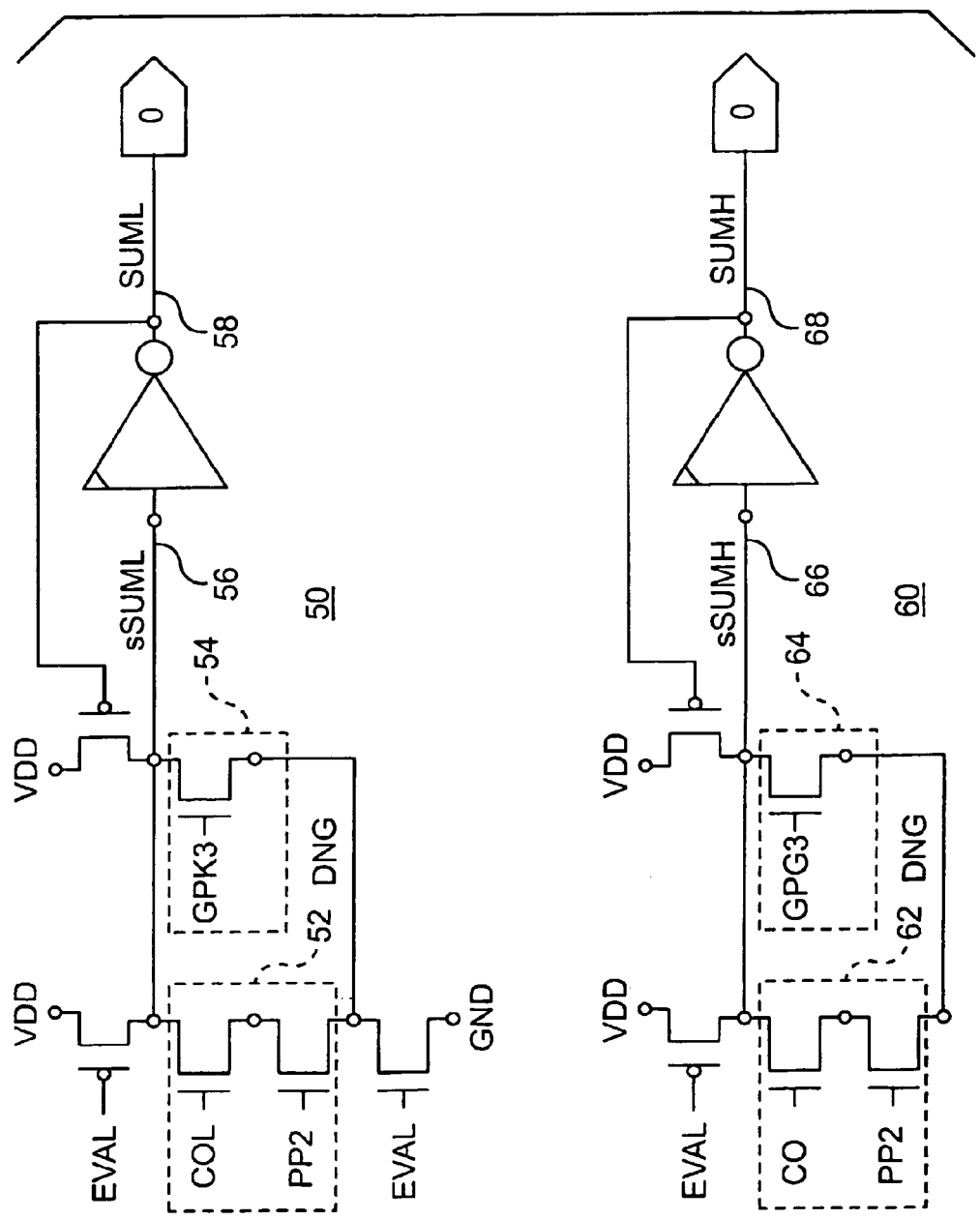
FIG. 3 is a transistor diagram of prior art circuitry for use in implementing an FMAC operation corresponding with the logic diagram in FIG. 1.
Figure 4:
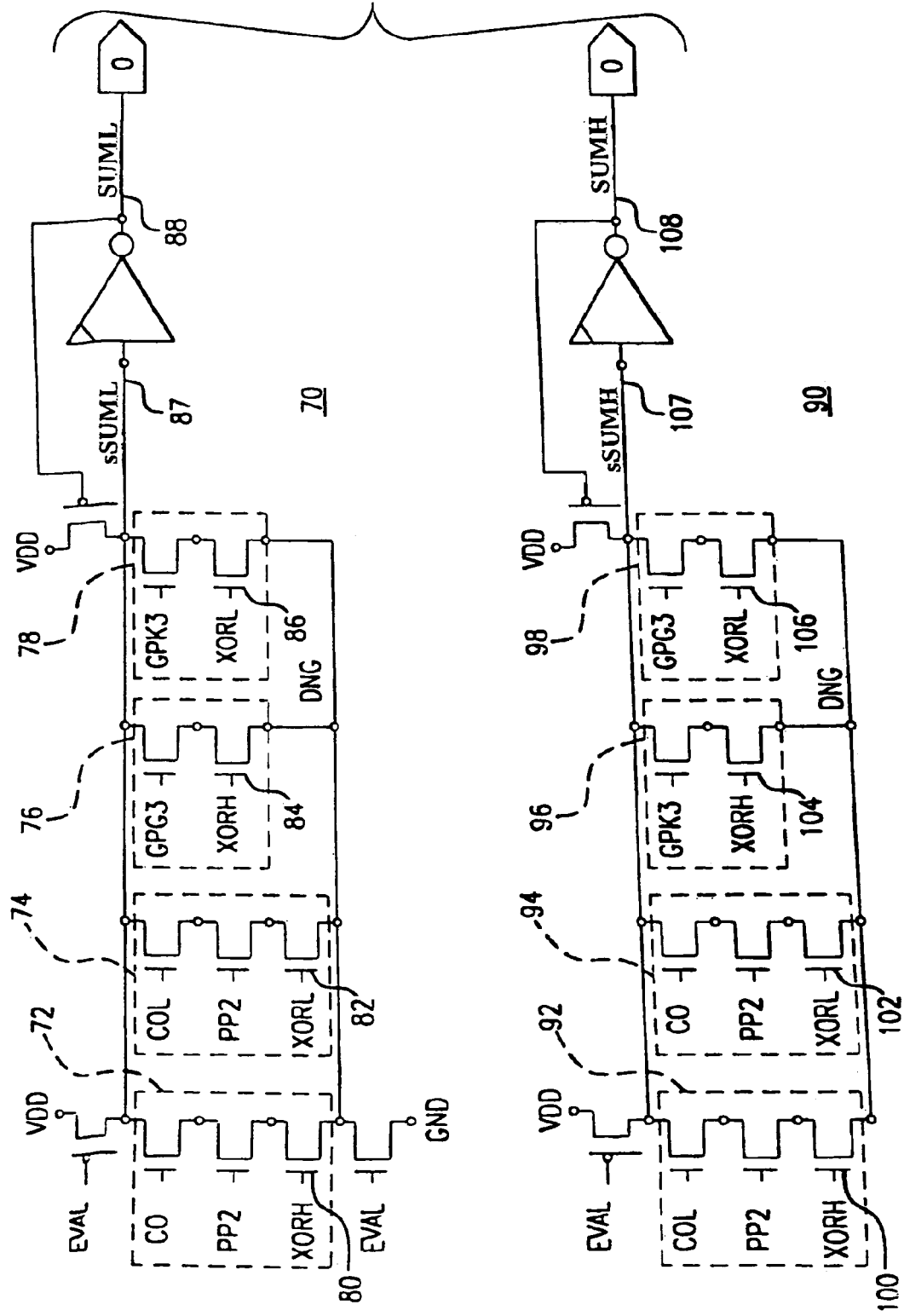
FIG. 4 is a transistor diagram of circuitry for use in implementing an FMAC operation corresponding with the logic diagram in FIG. 2.

FIG. 3 is a transistor diagram of prior art circuitry for implementing a final stage in CLA 24 of prior art circuit 10. In comparison, FIG. 4 is a transistor diagram illustrating an example of how the prior art circuitry in FIG. 3 is modified to implement the XOR operation in circuit 30. Since CLAs are known in the art, only the final stage is shown for illustrative purposes. In addition, only the final stage is shown as modified in this example, although additional modifications may be made based on a particular use of the CLA. More particular, the circuitry of FIG. 3 illustrates operations on only the most significant bit (MSB) of data, e.g., bit [7] of bits [7:0] within a byte of data.

As shown in FIG. 3, a final stage in CLA 24 includes two sets of circuits 50 and 60 corresponding with two bits for each input bit. Two bits exists because the implementation in this embodiment uses, for example, complementary logic referred to as dual rail Domino CMOS or mousetrap logic, which is known in the art. Circuit 50 includes a first stage 52 and second stage 54 producing a summation low (SUML) signal 58 and its complement, a signal sSUML 56. Complementary circuitry 60 includes a first stage 62 and second stage 64 producing a summation high (SUMH) signal 68 and its complement, signal sSUMH 66. The signals (CLK, DNG or GND, CARRY_INL, CARRY_INH, GROUP_PROPAGATE, GROUP_GENERATEH and GROUP_GENERATEL) shown in circuits 50 and 60 are known in the art with respect to FMAC operations.

In particular, the signal pair CARRY_INH and CARRY_INL is the input carry signal from the least significant 4-bit nibble. These two signals (illustrated in the figures using the symbols CIH and CIL, respectively) are mutually exclusive. In other words, if there is a carry from the least-significant nibble into the next nibble, CARRY_INH=1 and CARRY_INL=0; if no carry, then the values are reversed. Again, only operations for the MSB, bit [7], are shown in the figures. The signal GROUP_PROPAGATE is true if and only if the propagate (P) signals for bits [6:4] are true, i.e., this is a group propagate signal (illustrated in the figures using the symbol GRP). The signal pair GROUP_GENERATEH and GROUP_GENERATEL is also a mutually exclusive signal pair (illustrated in the figures using the symbols GGH and GGL, respectively) based upon the equation:

$$K[2]+P[2]*K[1]+P[2]*(P[1]*K[0])$$

Thus, if the equation is true, then GROUP_GENERATEH=1 and GROUP_GENERATEL=0; if not true, then the values are reversed FIG. 4 illustrates circuitry 70 and 90 containing modifications, respectively, to the aforedescribed circuits 50 and 60 for implementing the XOR operation in the CLA of logic block 40. As previously noted, circuits 70 and 90 illustrate processing on the most significant bit position in the final stage of the CLA in logic block 40. Accordingly, logic block 40 also includes additional known circuitry for processing of the other bits received from CSA 38 for the CLA operation. Circuit 70, as shown, includes redundant logic for implementing the XOR operation, and it includes two stages 72 and 76 corresponding with the functions of stages 52 and 54. Circuit 70 also includes a redundant stage 74 for stage 72, and a redundant stage 78 for stage 76. Within each of these stages an additional transistor implements the XOR operation. In particular, transistors 80, 82, 84 and 86 implement the XOR operation in, respectively, stages 72, 74, 76 and 78. Therefore, the result of the stages, without use of a second CSA (such as CSA 20), produces a SUML signal 88 and its complement, a signal sSUML 87.

Circuit 90 corresponds with circuit 60 and likewise illustrates modification to implement the XOR operation for the output complementary to stage 70. Circuit 90 includes stages 92 and 96 corresponding with, respectively, stages 62 and 64. Circuit 90 also includes a redundant stage 94 for stage 92, and a redundant stage 98 for stage 96. Each of these stages also includes an additional transistor for implementing the XOR operation. In particular, transistors 100, 102, 104 and 106 implement the XOR operation in, respectively, stages 92, 94, 96, and 98. Therefore, operation of these stages, without use of a second CSA, produces a SUMH signal 108 and its complement, a signal sSUMH 107.

Accordingly, the signals 87, 88, 107, and 108 produce the same resulting shift value on line 48 as the shift value produced on line 26 by signals 56, 58, 66, and 68. Since the XOR operation is performed through modification of a CLA to generate these signals, as shown in circuits 70 and 90, it occurs in parallel with the CLA operation and does not add any significant propagation delay. As described in connection with FIG. 3, the various signals (CLK, DNG or GND, CARRY_INL, CARRY_INH, GROUP_PROPAGATE, GROUP_GENERATEH and GROUP_GENERATEL) in circuits 70 and 90, aside from the XOR signals, are known in the art.

Figure 5:
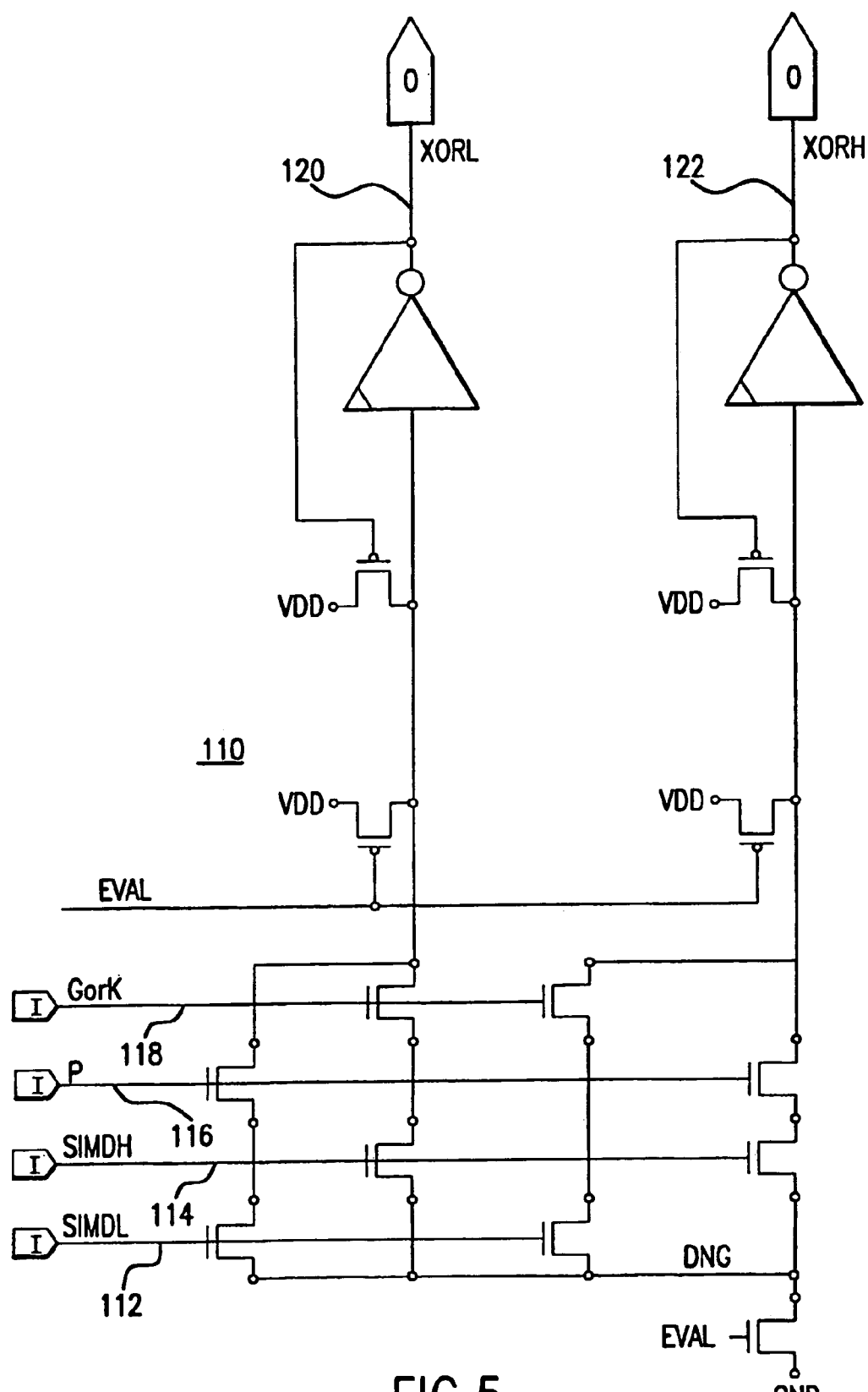
FIG. 5 is a transistor diagram of a control circuit for generating control signals for use in implementing an FMAC operation using the circuitry shown in FIG. 4.

FIG. 5 is a transistor diagram of a control circuit 110 for generating the XOR control signals, XOR high (XORH) and XOR low (XORL), used in circuits 70 and 90. These control signals correspond with control signal 46. The operation of control circuit 110 to generate the XORH and XORL signals occurs in parallel with the CLA operation in logic block 40 or other processing and thus does not affect the overall delay for the CLA operation in logic block 40. In operation, control circuit 110 receives as inputs a SIMD low (SIMDL) signal 112, a SIMD high (SIMDH) signal 114, a propogate (P) signal 116, and a Generate_or_Kill signal (GorK) 118. These input signals are known in the art with respect to FMAC operations. Control circuit 110 logically processes these input signals to generate the XORL signal 120 and its complement, XORH signal 122. In particular, control circuit 110 implements the following logic functions to generate those signals: XORL=(SIMDL)(P)+(SIMDH)(GorK); XORH=(SIMDH)(P)+(SIMDL)(GorK).

Accordingly, with the use of these control signals an entire CSA has been eliminated within the exemplary implementation for use in implementing an FMAC operation. The resulting propagation delay has likewise been eliminated. This modification thus results in increased speed of calculation for the FMAC operation and corresponding improvement in performance for other circuitry that uses this implementation for the FMAC operation. Although dual rail Domino CMOS has been shown to implement the modified CLA operation, any type of suitable logic may be used. In addition, if a particular application does not require or use complementary outputs, then only one modified final stage in the CLA can be used.

While the present invention has been described in connection with an exemplary embodiment, it will be understood that many modifications will be readily apparent to those skilled in the art, and this application is intended to cover any adaptations or variations thereof. For example, different types of CSAs and CLAs, different types of transistors to implement the XOR and other logic functions, different size operands, and various types of logic for generating the control signals may be used without departing from the scope of the invention. This invention should be limited only by the claims and equivalents thereof.

The invention claimed is:

1. An apparatus for use in performing a floating point multiply-accumulate operation, comprising:
    a plurality of latches that contain a plurality of exponents of operands for the operation;
    a carry-save adder, coupled to the latches, that receives the exponents of operands and performs a carry-save add operation on the exponents of operands to produce a first result;
    a control circuit for generating a control signal; and
    a logic block, coupled to the carry-save adder, that receives the first result and performs a carry-lookahead add operation on the first result to produce a second result, the logic block having a logic circuit that performs an exclusive-OR logic operation between a most significant bit of the second result and the control signal to produce a value for use in the floating point multiply-accumulate operation.

2. The apparatus of claim 1, wherein the logic circuit includes a logic stage for processing said most significant bit in the logic block.

3. The apparatus of claim 2, wherein the redundant logic stage performs the logic operation on the most significant bit in parallel with at least a portion of the carry-lookahead add operation.

4. The apparatus of claim 1, wherein the logic circuit performs the logic operation to produce a shift value for use in the floating point multiply-accumulate operation.

5. The apparatus of claim 1, wherein the control signal is a pair of complementary signals and wherein the control circuit generates the pair of complementary signals.

6. The apparatus of claim 1, wherein the logic block includes a carry-lookahead adder having complementary logic circuits for providing complementary outputs as the second result.

7. An apparatus for use in performing a floating point multiply-accumulate operation, comprising:
    a plurality of latches that contain a plurality of exponents of operands for the operation;
    a carry-save adder, coupled to the latches, that receives the exponents of operands and performs a carry-save add operation on the exponents of operands to produce a first result;
    a control circuit for generating a control signal based upon a Single Instruction Multiple Data operation; and
    a logic block, coupled to the carry-save adder, that receives the first result and performs a carry-lookahead add operation on the first result to produce a second result, the logic block having a logic circuit that performs an exclusive-OR logic operation between a most significant bit of the second result and the control signal to produce a value for use in the floating point nuiltiply-accumulate operation.

8. An apparatus for use in performing a floating point multiply-accumulate operation, comprising:
    a plurality of latches that contain a plurality of exponents of operands for the operation;
    a carry-save adder, coupled to the latches, that receives the exponents of operands and performs a carry-save add operation on the exponents of operands to produce a first result;
    a control circuit for generating a control signal; and
    a logic block, coupled to the carry-save adder, that receives the first result and performs a carry-lookahead add operation on the first result to produce a second result, the logic block having a logic circuit that performs an exclusive-OR logic operation between a most significant bit of the second result and the control signal to produce a value for use in the floating point multiply-accumulate operation,
    whereby the apparatus fon-ns the floating point multiply-accunmiate operation using a single carry-save adder (CSA).

* * * * *

UNITED STATES PATENT AND TRADEMARK OFFICE
CERTIFICATE OF CORRECTION

| | | |
|---|---|---|
| PATENT NO. | : 7,240,085 B2 | Page 1 of 1 |
| APPLICATION NO. | : 10/613095 | |
| DATED | : July 3, 2007 | |
| INVENTOR(S) | : Paul R. Thayer et al. | |

It is certified that error appears in the above-identified patent and that said Letters Patent is hereby corrected as shown below:

In column 6, lines 39-40, in Claim 7, delete "nuiltiply-accumulate" and insert -- multiply-accumulate --, therefor.

In column 6, line 59, in Claim 8, delete "fon-ns" and insert -- forms --, therefor.

In column 6, lines 59-60, in Claim 8, delete "multiply-accunmiate" and insert -- multiply-accumulate --, therefor.

Signed and Sealed this

Second Day of September, 2008

JON W. DUDAS
*Director of the United States Patent and Trademark Office*